(12) United States Patent
Meissl et al.

(10) Patent No.: US 10,578,984 B2
(45) Date of Patent: Mar. 3, 2020

(54) ADAPTIVE CHUCKING SYSTEM

(71) Applicant: Canon Kabushiki Kaisha, Tokyo (JP)

(72) Inventors: Mario Johannes Meissl, Austin, TX (US); Anshuman Cherala, Austin, TX (US); Byung-Jin Choi, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 286 days.

(21) Appl. No.: 15/385,189

(22) Filed: Dec. 20, 2016

(65) Prior Publication Data

US 2018/0173119 A1 Jun. 21, 2018

(51) Int. Cl.
*G03F 9/00* (2006.01)
*G03F 7/00* (2006.01)

(52) U.S. Cl.
CPC .......... *G03F 9/7042* (2013.01); *G03F 7/0002* (2013.01)

(58) Field of Classification Search
CPC .............................. G03F 9/7042; G03F 7/0002
See application file for complete search history.

(56) References Cited

U.S. PATENT DOCUMENTS

| | | | |
|---|---|---|---|
| 6,873,087 B1 | 3/2005 | Choi | |
| 6,932,934 B2 | 8/2005 | Choi | |
| 6,980,282 B2 | 12/2005 | Choi | |
| 6,982,783 B2 | 1/2006 | Choi | |
| 7,019,819 B2 | 3/2006 | Choi | |
| 7,157,036 B2 | 1/2007 | Choi | |
| 7,224,443 B2 | 5/2007 | Choi | |
| 7,307,697 B2 | 12/2007 | GanapathiSubramanian | |
| 7,504,268 B2 | 3/2009 | GanapathiSubramanian | |
| 8,913,230 B2 | 12/2014 | GanapathiSubramanian | |
| 2004/0124566 A1 | 7/2004 | Sreenivasan | |
| 2004/0188381 A1 | 9/2004 | Sreenivasan | |
| 2004/0211754 A1 | 10/2004 | Sreenivasan | |
| 2005/0187339 A1 | 8/2005 | Xu | |
| 2009/0140445 A1* | 6/2009 | Lu | B29C 43/003 264/40.1 |
| 2014/0138875 A1* | 5/2014 | Torii | G03F 7/0002 264/293 |
| 2015/0091230 A1 | 4/2015 | GanapathiSubramanian | |
| 2015/0131072 A1 | 5/2015 | Meissl | |

OTHER PUBLICATIONS

U.S. Appl. No. 15/010,774, filed Jan. 29, 2016, Meissl et al.

* cited by examiner

*Primary Examiner* — Jacob T Minskey
*Assistant Examiner* — Cedrick S Williams
(74) *Attorney, Agent, or Firm* — Canon U.S.A., Inc. IP Division

(57) ABSTRACT

Methods, systems, and apparatus for of adjusting a shape of an imprint lithography template, including identifying a shape of an active area positioned on a first side of the template, the active area including patterning features; determining a correspondence between a shape of an adaptive chuck and the shape of the active area positioned on the first side of the template, the adaptive chuck coupled to a second side of the template, the second side opposite the first side of the template; and adjusting, by an actuation system coupled to the adaptive chuck, the shape of the adaptive chuck based on the correspondence to obtain a target shape of the active area positioned on the first side of the template.

11 Claims, 5 Drawing Sheets

ADAPTIVE CHUCKING SYSTEM

BACKGROUND

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed.

SUMMARY

Innovative aspects of the subject matter described in this specification may be embodied in a method of adjusting a shape of an imprint lithography template, including identifying a shape of an active area positioned on a first side of the template, the active area including patterning features; determining a correspondence between a shape of an adaptive chuck and the shape of the active area positioned on the first side of the template, the adaptive chuck coupled to a second side of the template, the second side opposite the first side of the template; and adjusting, by an actuation system coupled to the adaptive chuck, the shape of the adaptive chuck based on the correspondence to obtain a target shape of the active area positioned on the first side of the template.

Other embodiments of these aspects include corresponding systems configured to perform the actions of the methods.

These and other embodiments may each optionally include one or more of the following features. For instance, the target shape of the active area is substantially the same as the identified shape of the active area, and wherein adjusting the shape of the adaptive chuck further comprises maintaining the identified shape of the active area positioned on the first side of the template. The target shape of the active area positioned on the first side of the template is substantially flat. Adjusting, by the actuation system coupled to the adaptive chuck, the shape of the active area positioned on the first side of the template in response to adjusting the shape of the adaptive chuck. Adjusting the shape of the active area positioned on the first side of the template further comprises adjusting a shape of the second side of the template, wherein the shape of the second side of the template is adjusted to obtain the target shape of the active area positioned on the first side of the template. A compliance of the template is greater than a compliance of a base plate, the actuation system positioned between the base plate and the adaptive chuck. Adjusting a length of a plurality of piezoelectric actuators of the actuation system to adjust the shape of the adaptive chuck, the adjusted length of each piezoelectric actuator of the plurality of piezoelectric actuators based on the correspondence between the shape of the adaptive chuck and the shape of the active area positioned on the first side of the template.

Innovative aspects of the subject matter described in this specification may be embodied in a system for adjusting the shape of an imprint lithography template, including an adaptive chuck configured to hold the template, the template including an active area positioned on a first side of the template, the active area including patterning features; a detection system configured to identify a shape of the active area positioned on the first side of the template; an actuation system, coupled to the adaptive chuck, configured to adjust a shape of the adaptive chuck; and a processor configured to i) determine a correspondence between the shape of the adaptive chuck and the identified shape of the active area positioned on the first side of the template and ii) provide a signal to the actuation system based on the correspondence such that the actuation system adjusts the shape of the adaptive chuck to obtain a target shape of the active area of the template.

Other embodiments of these aspects include corresponding method configured to perform the actions of the system.

These and other embodiments may each optionally include one or more of the following features. For instance, the target shape of the active area is substantially the same as the identified shape of the active area, the actuation system further configured to maintain the identified shape of the active area positioned on the first side of the template. The target shape of the active area positioned on the first side of the template is substantially flat. The actuation system further configured to adjust the shape of the active area positioned on the first side of the template based on adjusting the shape of the adaptive chuck. The actuation system further configured to adjust a shape of a second side of the template to obtain the target shape of the active area positioned on the first side of the template, the second side of the template opposite the first side of the template. The system further including a base plate, the actuation system positioned between the base plate and the adaptive chuck, wherein a compliance of the template is greater than a compliance of the base plate. The actuation system comprises a plurality of piezoelectric actuators, the actuation system adjusting a length of each piezoelectric actuator of the plurality of piezoelectric actuators to adjust the shape of the adaptive chuck, the adjusted length of each piezoelectric actuator of the plurality of piezoelectric actuators based on the correspondence between the shape of the adaptive chuck and the shape of the active area positioned on the first side of the template.

Particular implementations of the subject matter described in this specification can be implemented so as to realize one or more of the following advantages. Implementations of the present disclosure provide improved durability of the template, minimization of contact of the template with the actuators, and improvement of control of the shape of the template.

The details of one or more embodiments of the subject matter described in this specification are set forth in the accompanying drawings and the description below. Other potential features, aspects, and advantages of the subject matter will become apparent from the description, the drawings, and the claims.

DETAILED DESCRIPTION

Figure 1:
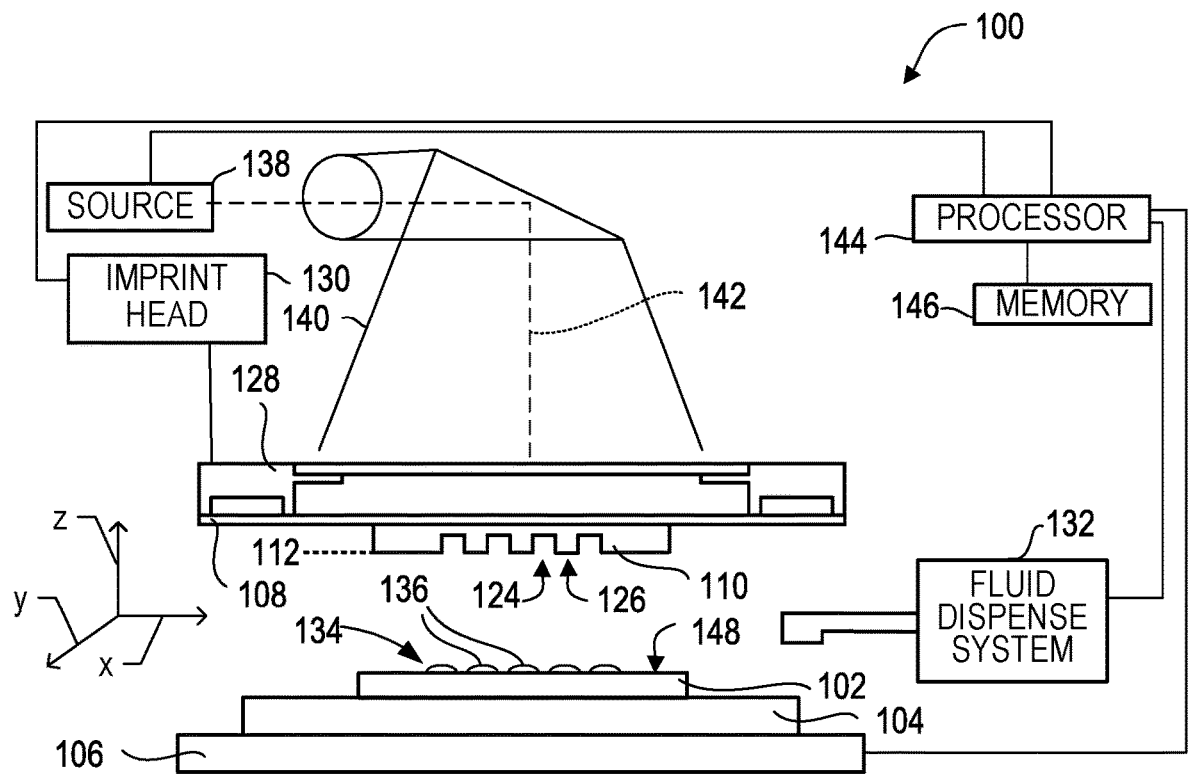
FIG. 1 illustrates a simplified side view of a lithographic system.

FIG. 1 illustrates an imprint lithography system 100 that forms a relief pattern on a substrate 102. The substrate 102 may be coupled to a substrate chuck 104. In some examples, the substrate chuck 104 can include a vacuum chuck, a pin-type chuck, a groove-type chuck, an electromagnetic chuck, and/or the like. Exemplary chucks are described in U.S. Pat. No. 6,873,087, which is hereby incorporated by reference herein. The substrate 102 and the substrate chuck 104 may be further supported by a stage 106. The stage 106 provides motion about the x- and y-axes, and rotation about the z-axis. The stage 106, the substrate 102, and the substrate chuck 104 may also be positioned on a base (not shown).

The imprint lithography system 100 further includes an imprint lithography template 108 that is spaced-apart from the substrate 102. In some examples, the template 108 includes a mesa 110 (mold 110) that extends from the template 108 towards the substrate 102. In some examples, the mold 110 includes a patterning surface 112. The template 108 and/or the mold 110 may be formed from such materials including, but not limited to, fused-silica, quartz, silicon, organic polymers, siloxane polymers, borosilicate glass, fluorocarbon polymers, metal, hardened sapphire, and/or the like. In the illustrated example, the patterning surface 122 includes a plurality of features defined by spaced-apart recesses 124 and/or protrusions 126. However, in some examples, other configurations of features are possible. The patterning surface 112 may define any original pattern that forms the basis of a pattern to be formed on substrate 102.

The template 108 may be coupled to a template chuck 128. In some examples, the template chuck 128 can include a vacuum chuck, a pin-type chuck, a groove-type chuck, an electromagnetic chuck, and/or the like. Exemplary chucks are described in U.S. Pat. No. 6,873,087. Further, the template chuck 128 may be coupled to an imprint head 130 such that the template chuck 128 and/or the imprint head 130 may be configured to facilitate movement of the template 118.

The imprint lithography system 100 may further comprise a fluid dispense system 132. The fluid dispense system 132 may be used to deposit a polymerizable material 134 on the substrate 102. The polymerizable material 134 may be positioned upon the substrate 102 using techniques such as drop dispense, spin-coating, dip coating, chemical vapor deposition (CVD), physical vapor deposition (PVD), thin film deposition, thick film deposition, and/or the like. In some examples, the polymerizable material 134 is positioned upon the substrate 102 before and/or after a desired volume is defined between the mold 110 and the substrate 102. The polymerizable material 134 may comprise a monomer as described in U.S. Pat. No. 7,157,036 and U.S. Patent Application Publication No. 2005/0187339, all of which are hereby incorporated by reference herein. In some examples, the polymerizable material 134 is positioned upon the substrate 102 as a plurality of droplets 136.

Figure 2:
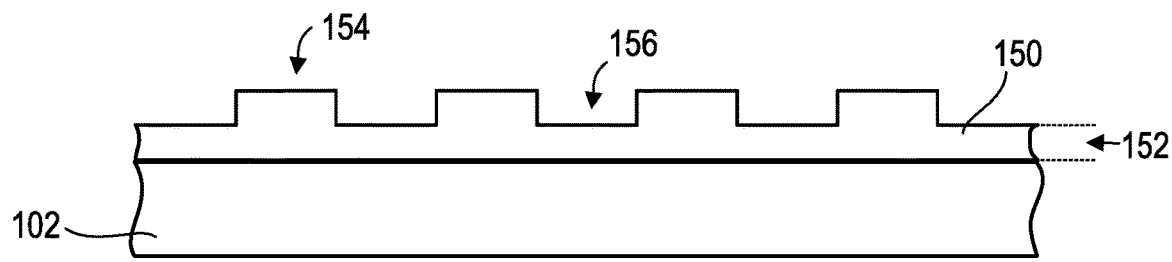
FIG. 2 illustrates a simplified side view of the substrate shown in FIG. 1 having a patterned layer positioned thereon.

Referring to FIGS. 1 and 2, the imprint lithography system 100 may further comprise an energy source 138 coupled to direct energy 140 along a path 142. In some examples, the imprint head 130 and the stage 106 is configured to position the template 108 and the substrate 102 in superimposition with the path 142. The imprint lithography system 100 may be regulated by a processor 144 in communication with the stage 106, the imprint head 130, the fluid dispense system 132, and/or the energy source 138, and may operate on a computer readable program stored in a memory 146.

In some examples, the imprint head 130, the stage 106, or both, vary a distance between the mold 110 and the substrate 102 to define a desired volume therebetween that is filled by the polymerizable material 134. For example, the imprint head 130 may apply a force to the template 108 such that the mold 110 contacts the polymerizable material 134. After the desired volume is filled by the polymerizable material 134, the energy source 138 produces energy 40, e.g., broadband ultraviolet radiation, causing the polymerizable material 134 to solidify and/or cross-link conforming to shape of a surface 148 of the substrate 102 and the patterning surface 122, defining a patterned layer 150 on the substrate 102. In some examples, the patterned layer 150 may comprise a residual layer 152 and a plurality of features shown as protrusions 154 and recessions 156, with the protrusions 154 having a thickness $t_1$ and the residual layer 152 having a thickness $t_2$.

The above-described system and process may be further implemented in imprint lithography processes and systems referred to in U.S. Pat. No. 6,932,934, U.S. Patent Application Publication No. 2004/0124566, U.S. Patent Application Publication No. 2004/0188381, and U.S. Patent Application Publication No. 2004/0211754, each of which is hereby incorporated by reference herein.

It is desirable to minimize, if not prevent, planarity (e.g., non-flatness) errors of the template 108, and in particular, the mold 110. Specifically, non-planarity of the template 108 can result in image placement errors (e.g., distortion) of a pattern formed in the polymerizable material 134 on the substrate 102. In general, chucking systems attempt to abrogate the non-planarity of the template 108 by employing actuation systems in direct contact with the template 108. However, such chucking systems can exacerbate particle formation and particle defects within the system 100. Provided herein are methods and systems to compensate for planarity errors of the template 108, while minimizing contact between the actuation system and the template 108, and further providing increased durability of the template 108 and increased control of the planarity of the template 108. These methods rely, in part, on an adaptive chuck top plate that is positioned between the actuation system and the template 108.

Figure 3:
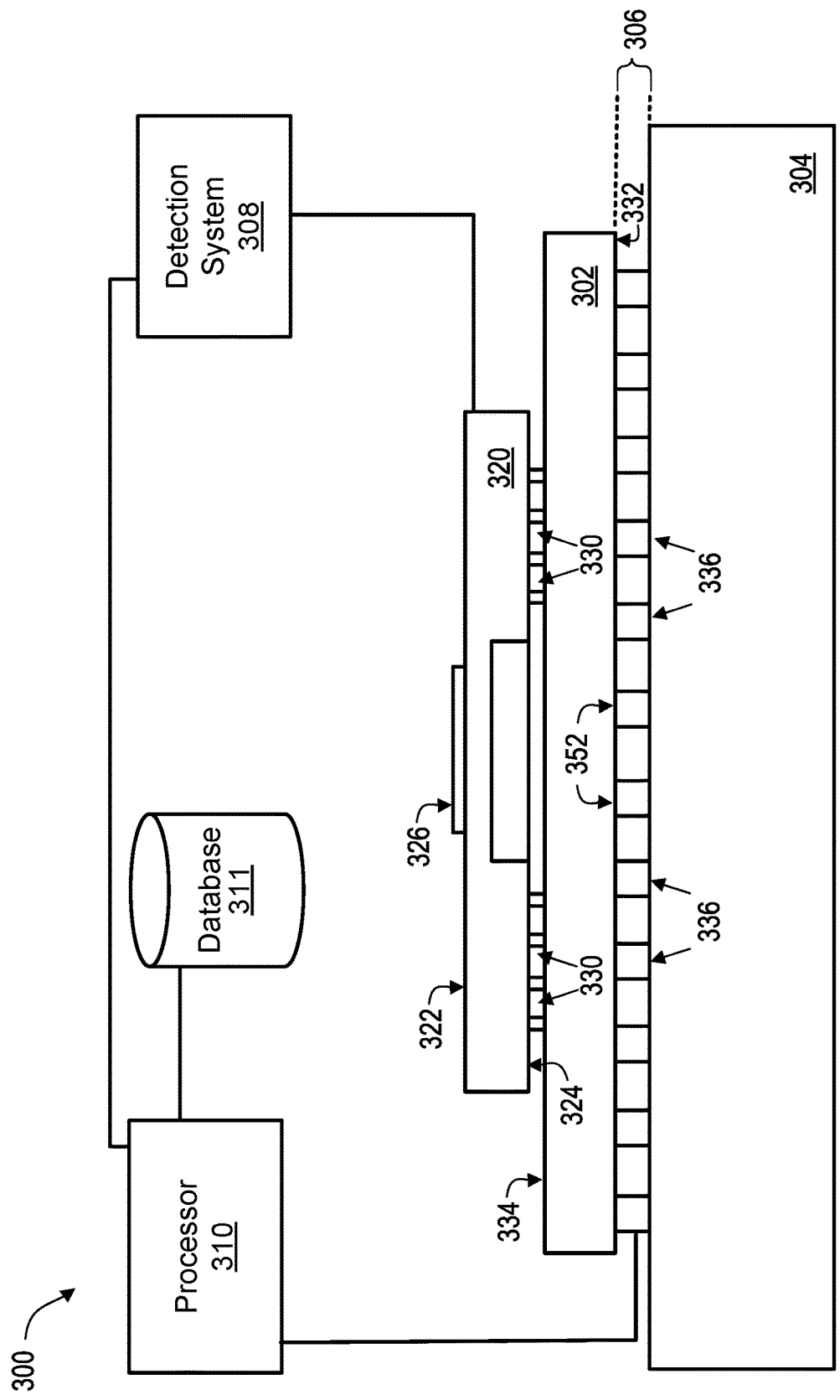
FIG. 3 illustrates a side view of a chucking system.

FIG. 3 illustrates a chucking system 300. The chucking system 300 holds, or maintains, a desired positioning, of one or more templates. The chucking system 300 includes an adaptive chuck top plate (or adaptive chuck) 302, a base plate 304, an actuation system 306, a detection system 308, a processor 310, and a database 311. The adaptive chuck 302 can be similar to the template chuck 128, mentioned above. The adaptive chuck 302 is coupled to a template 320 (i.e., holds, or chucks the template 320).

The template 320 includes a first side 322 and a second side 324, the second side 324 positioned opposite of the first side 322. The template 320 further includes an active area 326 positioned on the first side 322 of the template 320, similar to the mold 110 of FIG. 1. In some examples, the active area 326 includes pattern features similar to the recesses 124 and protrusions 126 of FIG. 1. In some examples, the active area 326 is substantially blank. In some examples, the template 320 includes a hollow (cored-out) body. That is, a thickness of the template 320 proximate to the active area 326 is substantially thinner than a respective thickness of the template 320 outside of the active area 326.

In some examples, the template 320 includes a substantially uniform thickness across the body of the template 320.

As mentioned above, the adaptive chuck 302 is coupled to the template 320, and more specifically coupled to the second side 324 of the template 320. The adaptive chuck 302 can define chambers 330 between the template 320 and the adaptive chuck 302, and specifically, between the second side 324 of the template 320 and the adaptive chuck 302. The chambers 330 can provide cavities that a pressure (positive and/or negative) can be applied to by a pressure source (not shown) that is coupled to the adaptive chuck 302. The number of chambers 330 can vary depending on the desired application.

The actuation system 306 is coupled to the adaptive chuck 302, and is configured to adjust a shape of the adaptive chuck 302. Specifically, the actuation system 306 is coupled to a side 332 of the adaptive chuck 302 that is opposite of a side 334 of the adaptive chuck 302 that is coupled to the template 320. In general, the actuation system 306 applies a force (or multiple forces) to the side 332 of the adaptive chuck 302 to adjust the shape of the adaptive chuck 302; that is, adjust a shape of the side 332, and in turn, adjust a shape of the side 334 of the adaptive chuck 302. In some examples, the actuation system 306 includes a plurality of piezoelectric actuators 336. In some examples, the chucking system 300 further includes vacuum seals (not shown for ease of illustration) positioned between the adaptive chuck 302 and the base plate 304 about a perimeter of the adaptive chuck 302. The vacuum seals can be a compliant seal to minimize interference with a shape of the adaptive chuck 302.

In some examples, the detection system 308 is configured to identify a shape (e.g., topography) of the active area 326 of the template 320. The detection system 308 can include a laser interferometry system, or any desirable detection system. In some examples, the detection system 308 is configured to identify a plane of the active area 326 of the template 320, e.g., an in-plane displacement detection system. In some examples, the detection system 308 measures the overlay of imprinted wafers (as described above in FIG. 1) to further identify the shape of the active area 326 of the template 320 (e.g., a feedback signal).

The processor 310 is in communication with the detection system 308 and the actuation system 306, and provides a signal, based at least on the identified shape of the active area 326, to the actuation system 306 to adjust the shape of the adaptive chuck 302. The processor 310 can further be in communication with the database 311. In some examples, the database 311 can store one or more database tables (e.g., look-up tables) that indicate correspondences (or relationships) between the shape of the adaptive chuck 302 and the shape of the active area 326, and further, correspondence between force modulation applied by the actuation system 306 and the shape of the adaptive chuck 302.

Figure 4A:
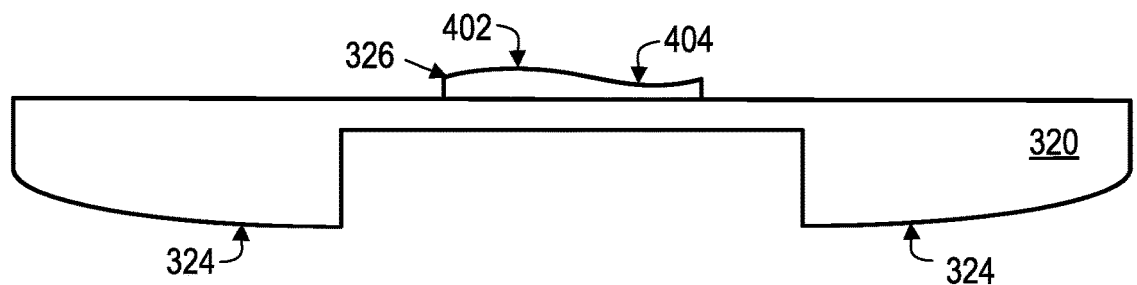
FIGS. 4A, 5A illustrate a side view of a template in a natural state.

FIG. 4A illustrates the template 320 including the active area 326 having an undesirable shape. Specifically, the active area 326 can include one or more undulations with variations in frequency, depth, and spacing. It may be desirable to adjust the shape of a surface (topography) of the active area 326, e.g., such that the shape of the active area 326 is substantially flat.

In some implementations, the detection system 308 identifies the shape of the active area 326 of the template 320. The detection system 308 can provide a signal to the processor 310 indicating the identified shape of the active area 326. The signal can include measurement data indicating the shape of the active area 326 of the template 320. However, the identified shape of the active area 326 differs from a target shape of the active area 326. For example, the target shape of the active area 326 can include a substantially flat shape. In the illustrated example, the detection system 308 identifies the shape of the active area 326 to include a hill 402 and a valley 404, and generate corresponding shape-based data indicating such to be included by the signal provided to the processor 310. In some examples, the shape-based data can include a plurality of positional points of the hill 402 and the valley 404 with respect to a reference surface or plane.

Referring to FIG. 3, the processor 310 receives the signal from the detection system 308 including the shape-based data of the active area 326 of the template 320. The processor 310 determines a correspondence between the shape of the adaptive chuck 302 and the identified shape of the active area 326 of the template 320. For example, the processor 310 accesses the database 311 and determines from one or more database tables stored by the database 311 a correspondence between the shape of the adaptive chuck 302 and the identified shape of the active area 326, and more specifically, as the adaptive chuck 302 is coupled to the template 320, a correspondence between the shape of the second side 324 of the template 320 and the identified shape of the active area 326. The correspondence can indicate correctional values (e.g., force magnitudes) such that when applied (by the actuation system 306) at a plurality of points of the adaptive chuck 302 spanning the x- and y-direction of the adaptive chuck 302, the adaptive chuck 302 in turn modulates (or adjusts) the shape of the template 320 (at the second side 324) such that the active area 326 displays the target shape, described further below.

In the illustrated example, the processor 310, based on the shape-based data of the positional points of the active area 326 (e.g., positional data associated with the hill 402 and the valley 404), accesses the database 311 to identify correctional values to be applied by the actuation system 306 to the adaptive chuck 302 such that when applied, the adaptive chuck 302 modulates the shape of the template 320 (and specifically the second side 324 of the template 320) such that the active area 326 displays the target shape.

The processor 310 generates a signal based on the determined correspondence and provides the signal to the actuation system 306. The actuation system 306 receives the signal and adjusts the shape of the adaptive chuck 302 to obtain a target shape of the active area 326 of the template 320. That is, the actuation system 306 adjusts the shape of the adaptive chuck 302 based on the correspondence and the correctional values that are identified from the database 311. Specifically, the correctional values are applied by the actuation system 306 to adjust the shape of the adaptive chuck 302.

In the illustrated example, the actuation system 306 includes a plurality of piezoelectric actuators 336. An end 352 of each of the piezoelectric actuators 336 is in contact with the second side 324 of the adaptive chuck 302. A length/of each of the piezoelectric actuators 336 establishes the shape of the adaptive chuck 302. That is, as the length/of the piezoelectric actuators 336 is adjusted, the shape of the adaptive chuck 302 is adjusted correspondingly. The signal provided by the processors 310 provided to the actuation system 306 can be associated with a respective length for one or more of the piezoelectric actuators 336 that the actuation system 306 adjusts (or sets) such that the shape of the adaptive chuck 302 is adjusted accordingly, and in turn, adjusts the shape of the active area 326 of the template 320. In some examples, the signal provided by the processor 310 includes one or more voltage levels to be applied by the piezoelectric actuators 336 to adjust a respective length of the piezoelectric actuators 336 such that the shape of the adaptive chuck 302 is adjusted accordingly, as described above.

Furthermore, as the actuation system 306 adjusts the shape of the adaptive chuck 302, the shape of the second (back) side 324 of the template 320 is correspondingly adjusted. That is, as the template 320 is coupled to (e.g., chucked) to the adaptive chuck 302, as the actuation system 306 adjusts the shape of adaptive chuck 302, the adaptive chuck 302 in turn adjusts the shape of the template 320, including adjusting the shape of the second side 324 of the template 320. As the shape of the active area 326 is based on the shape of the second side 324, the shape of the active area 326 is adjusted as well, e.g., adjusted to the target shape. As a result of adjusting the shape of the adaptive chuck 302 by the actuation system 306, the shape of the active area 326 of the template 320 is adjusted, e.g., adjusted to the target shape.

Figure 4B:
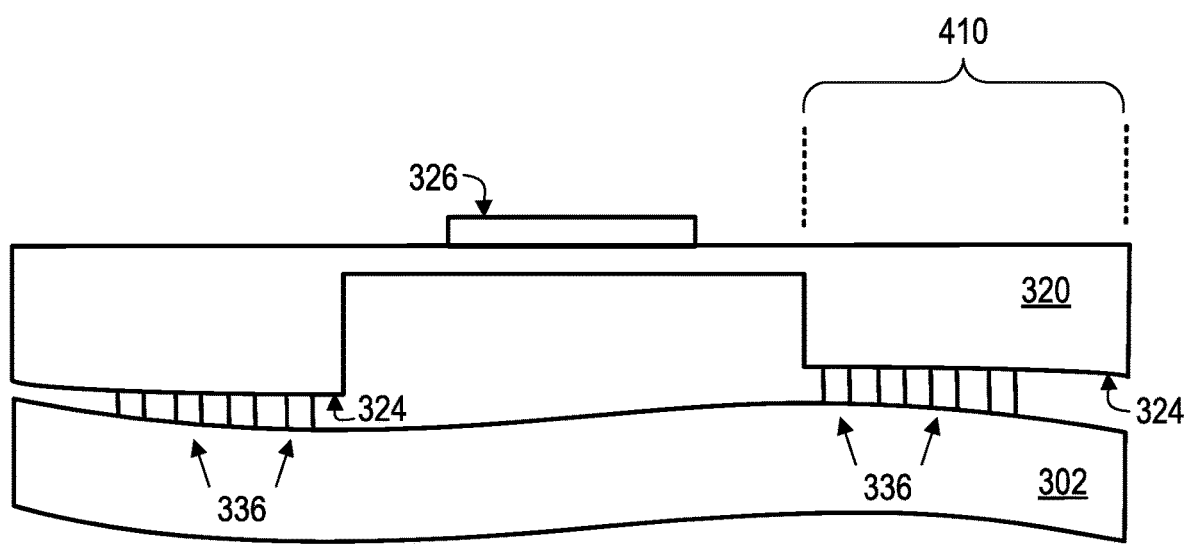
FIGS. 4B, 5B illustrate a side view of the template coupled to a chucking system.

FIG. 4B illustrates the template 320 including the active area 326 having the target shape. Specifically, FIG. 4B illustrates the adaptive chuck 302 coupled to the template 320, the adaptive chuck 302 including an adjusted shape from the actuation system 306. That is, the actuation system 306, based on the signal from the processor 310, adjusts the adaptive chuck 302 to include the adjusted shape. As a result of the actuation system 306 adjusting the shape of the adaptive chuck 302, the second side 324 of the template 320 is adjusted accordingly. That is, the second side 324 of the template 320 is adjusted based on the determined correspondence stored by the database 311. In the illustrated example, a shape profile (or topography) of the second side 324 is adjusted such that a portion 410 of the second side 324 includes, inter alia, a concave curvature from the point of view of the adaptive chuck 302. As a result of the second side 324 of the template 320 being adjusted by the adaptive chuck 302, the active area 326 of the template 320 is adjusted, based on the correspondence between the second side 324 and the active area 326, such that the active area 326 includes the target shape. In the illustrated example, the active area 326 is adjusted to include a substantially flat shape profile (or topography). In some examples, the length/ of one or more of the piezoelectric actuators 336 is adjusted to adjust the shape of the adaptive chuck 302, and further such that the portion 410 of the second side 324 of the template 320 includes the aforementioned concave curvature.

In some examples, a compliance of the adaptive chuck 302 is greater than a compliance of the base plate 304. For example, the compliance can include a resistance to shape deformation. Thus, as the adaptive chuck 302 is more compliant than the base plate 304, the adaptive chuck 302 is more likely to deform (or be modulated) as compared to the base plate 304 by the plurality of piezoelectric actuators 336 positioned between the adaptive chuck 302 and the base plate 304. Thus, an accuracy of the shape modulation of the adaptive chuck 302 by the actuation system 306 is improved as the change in length of the piezoelectric actuators 336 is more likely to affect the shape of the adaptive chuck 302 as compared to the base plate 304. Additionally, the compliance of the template 320 is greater than the compliance of the base plate 304. Thus, the template 320 is more likely to deform (or be modulated) as compared to the base plate 304, increasing an accuracy of the obtaining the target shape of the active area 326 of the template 320.

Figure 5A:
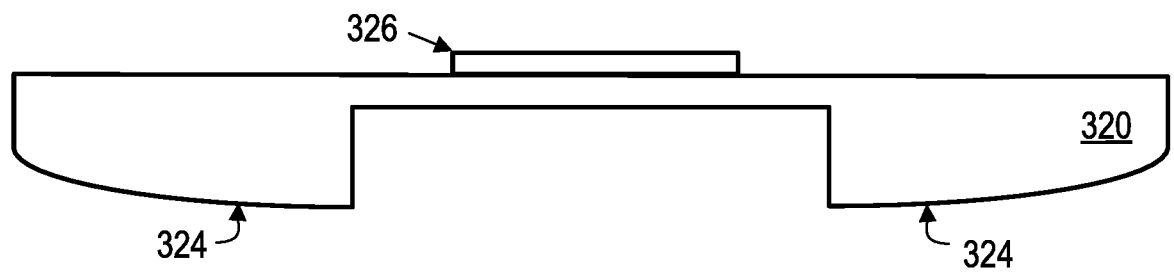

FIG. 5A illustrates the template 320 including the active area 326 being substantially flat. It may be desirable to maintain a natural shape (e.g., the substantially flat profile, or topography) of the active area 326.

Specifically, as mentioned above, the detection system 308 identifies the shape of the active area 326 of the template 320. In the illustrated example, the detection system 308 identifies the shape of the active area 326 as substantially flat. The detection system 308 provides the signal to the processor 310 indicating that the identified shape of the active area 326 is substantially flat. Thus, the identified shape of the active area 326 is substantially the same as the target shape of the active area 326.

The processor 310 receives the signal from the detection system 308 including the shape-based data of the active area 326 of the template 320, and specifically, that the active area 326 is substantially flat. In some examples, it desired to maintain the natural shape of the active area 326; that is, maintain the identified shape of the active area 326 of the template 320.

In some examples, similar to that mentioned above with respect to FIG. 4A, the processor 310 accesses the database 311 and determines a correspondence between the shape of the adaptive chuck 302 and the natural shape of the active area 326, and more specifically, a correspondence between the shape of the second side 324 of the template 320 and the natural shape of the active area 326. The correspondence can indicate values (e.g., force magnitudes) such that when applied at a plurality of points of the adaptive chuck 302 spanning the x- and y-direction of the adaptive chuck 302, the adaptive chuck 302 matches the shape of the second side 324 of the template 320 such that the active area 326 maintains the natural shape.

In the illustrated example, the processor 310, based on maintaining the natural shape of the active area 326, accesses the database 311 to identify values to be applied by the actuation system 306 to the adaptive chuck 302 such that when applied, the adaptive chuck 302 matches the shape of the template 320 (and specifically the second side 324 of the template 320) such that the natural shape of the active area 326 is maintained.

The processor 310 generates a signal based on maintaining the natural shape of the active area 326 and provides the signal to the actuation system 306. The actuation system 306 receives the signal, and maintains the identified (natural) shape of the active area 326. That is, the actuation system 306 matches the shape of the adaptive chuck 302 to the second side 324 of the template 320 based on the correspondence and the values that are identified from the database 311. Specifically, the correctional values are applied by the actuation system 306 to match the shape of the adaptive chuck 302 to the second side 324 of the template 320. In the illustrated example, the actuation system 306 adjusts the length/of one or more of the piezoelectric actuators 336 such that the adaptive chuck 302 matches the second side 324 of the template 320, and thus, maintain the natural shape of the active area 326.

Figure 5B:
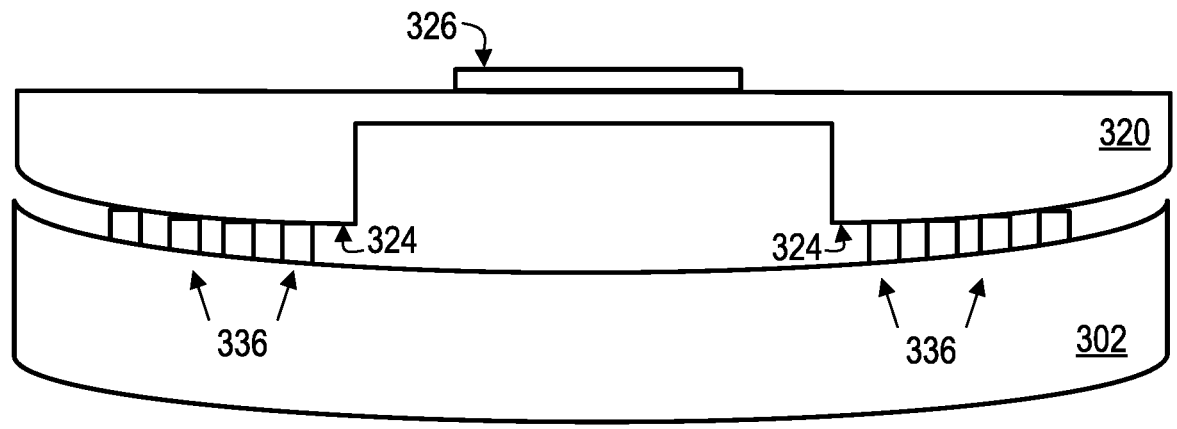

FIG. 5B illustrates the template 320 including the natural shape of the active area 326 being maintained. Specifically, FIG. 5B illustrates the adaptive chuck 302 coupled to the template 320. The actuation system 306, based on the signal from the processor 310, adjusts the shape of the adaptive chuck 302 to match the second side 324 of the template 320. As a result, the natural shape (e.g., substantially flat) of the active area 326 of the template 320 is maintained.

In some examples, the template 320 can be used in a first system (e.g., the imprint lithography system 100) and additionally used in a separate, second system. That is, the template 320, and the active area 326, can have a first profile (topography) within the first system similar to that mentioned above (e.g., as a result of adjusting the adaptive chuck 302 by the actuation system 306). It is desirable to provide a substantially similar profile of the active area 326 when the template 320 is used in the second system. That is, after employing the template 320 within the first system, and having the first profile associated with the active area 326, employing the template 320 in a second system and providing substantially the same profile of the active area 326. By providing substantially the same profile of the active area 326 within two differing imprint lithography systems, image placement error of a pattern formed by the active area 326 is minimized, if not prevented.

To provide substantially the same profile of the active area 326 in the second system, shape-based data is provided to the second system pertaining to the first profile of the active area 326, e.g., provided to a processor. Similar to that mentioned above with respect to FIG. 3, the second system identifies the shape of the substrate 320 within the second system and adjusts such (e.g., by adjusting a similar adaptive chuck by a similar actuation system) to obtain the second profile of the substrate 320 that is substantially similar to the first profile of the template 320.

In some examples, the first system can include a template replication system (e.g., a system to generate the template 320 utilizing imprint lithography), and the second system can include a mass reproduction system (e.g., a system utilizing the template 320 to pattern wafers).

Figure 6:
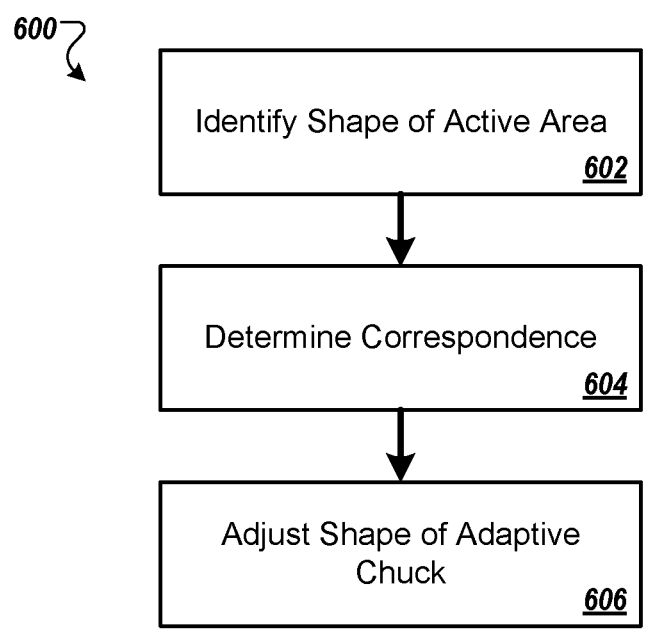
FIG. 6 illustrates a flow chart of an example method of adjusting a shape of a template.

FIG. 6 provides an example method of adjusting a shape of a template. The process 600 is illustrated as a collection of referenced acts arranged in a logical flow graph. The order in which the acts are described is not intended to be construed as a limitation, and any number of the described acts can be combined in other orders and/or in parallel to implement the process.

A shape of an active area positioned on a first side of the template is identified (602). For example, the detection system 308 identifies the shape of the active area 326 positioned on the first side 322 of the template 320. In some examples, the active area 326 includes patterning features. A correspondence between a shape of an adaptive chuck and the shape of the active area positioned on the first side of the template is determined (604). For example, the processor 310 determines a correspondence between the shape of the adaptive chuck 302 and the identified shape of the active area 326 of the template 320. In some examples, the adaptive chuck 302 is coupled to the second side 324 of the template 320, the second side 324 opposite the first side 322 of the template 320. The shape of the adaptive chuck is adjusted based on the correspondence to obtain a target shape of the active area positioned on the first side of the template (606). For example, the actuation system 306 adjusts the shape of the adaptive chuck 302 to obtain a target shape of the active area 326 of the template 320.

The invention claimed is:

1. A system for adjusting the shape of an imprint lithography template, the system comprising:
    an adaptive chuck configured to hold the template, the template including an active area positioned on a first side of the template, the active area including patterning features;
    a detection system configured to identify a shape of the active area positioned on the first side of the template;
    an actuation system, coupled to the adaptive chuck, configured to adjust a shape of the adaptive chuck; and
    a processor configured to i) access a database comprising database tables that indicate correspondences between the shape of the adaptive chuck and the identified shape of the active area, ii) determine, based on the one or more database tables, a correspondence between the shape of the adaptive chuck and the identified shape of the active area positioned on the first side of the template, and iii) provide a signal to the actuation system based on the correspondence such that the actuation system adjusts the shape of the adaptive chuck to obtain a target shape of the active area of the template.

2. The system of claim 1, wherein the target shape of the active area is substantially the same as the identified shape of the active area, the actuation system further configured to maintain the identified shape of the active area positioned on the first side of the template.

3. The system of claim 1, wherein the target shape of the active area positioned on the first side of the template is substantially flat.

4. The system of claim 1, wherein the actuation system comprises a plurality of piezoelectric actuators, the actuation system adjusting a length of each piezoelectric actuator of the plurality of piezoelectric actuators to adjust the shape of the adaptive chuck, the adjusted length of each piezoelectric actuator of the plurality of piezoelectric actuators based on the correspondence between the shape of the adaptive chuck and the shape of the active area positioned on the first side of the template.

5. The system of claim 1, wherein the processor is configured to determine the correspondence between a plurality of piezoelectric actuators of the actuation system and the shape of the adaptive chuck, wherein the shape of the active area positioned on the first side of the template is based on the correspondence between the plurality of piezoelectric actuators of the actuation system and the shape of the adaptive chuck.

6. The system of claim 1, wherein the database is configured to store database tables that indicate correspondences between force modulation applied by the actuation system and the shape of the adaptive chuck.

7. The system of claim 1, wherein the processor is configured, based on the identified shape of the active area, to access the database to identify correctional values to be applied by the actuation system to the adaptive chuck such that when applied, the adaptive chuck modulates the shape of the template such that the active area displays the target shape.

8. The system of claim 1, the actuation system further configured to adjust the shape of the active area positioned on the first side of the template based on adjusting the shape of the adaptive chuck.

9. The system of claim 8, the actuation system further configured to adjust a shape of a second side of the template to obtain the target shape of the active area positioned on the first side of the template, the second side of the template opposite the first side of the template.

10. A template replication system for transferring pattern features formed on a first template to an imprint resist applied on a second template which is blank by performing an imprint, the system comprising:
    an adaptive chuck configured to hold the second template, the second template including an active area positioned on a first side of the template and transferred with the pattern features;
    a detection system configured to identify a shape of the active area positioned on the first side of the second template;

an actuation system, coupled to the adaptive chuck, configured to adjust a shape of the adaptive chuck; and a processor configured to i) determine a correspondence between the shape of the adaptive chuck and the identified shape of the active area positioned on the first side of the second template and ii) provide a signal to the actuation system based on the correspondence such that the actuation system adjusts the shape of the adaptive chuck to obtain a target shape of the active area of the second template.

11. The template replication system of claim 10, wherein the processor is further configured to access a database comprising database tables that indicate correspondences between the shape of the adaptive chuck and the identified shape of the active areas and to determine, based on the one or more database tables, the correspondence between the shape of the adaptive chuck and the identified shape of the active area positioned on the first side of the template.

* * * * *